United States Patent [19]
Brent

[11] Patent Number: 5,638,067
[45] Date of Patent: Jun. 10, 1997

[54] VARIABLE LENGTH CODER

[75] Inventor: Wilson W. Brent, Singapore, Singapore

[73] Assignee: Matsushita Electric Industrial Co., Ltd., Osaka, Japan

[21] Appl. No.: 305,688

[22] Filed: Sep. 13, 1994

[30] Foreign Application Priority Data

Sep. 14, 1993 [JP] Japan ................................. 5-227694

[51] Int. Cl.⁶ ...................................... H03M 7/40
[52] U.S. Cl. ............................................... 341/67
[58] Field of Search ............................. 341/60, 63, 64, 341/65, 67, 106

[56] References Cited

U.S. PATENT DOCUMENTS 4,506,325 3/1985 Bennett et al. .
4,670,851 6/1987 Murakami et al. .
4,901,075 2/1990 Vogel .
5,436,626 7/1995 Fujiwara et al. ............................ 341/67

FOREIGN PATENT DOCUMENTS 272969 6/1988 European Pat. Off. .
527011 2/1993 European Pat. Off. .

*Primary Examiner*—Brian K. Young
*Attorney, Agent, or Firm*—Beveridge, DeGrandi, Weilacher & Young, L.L.P.

[57] ABSTRACT

A variable length coder for converting fixed bit length data to variable bit length data has a codetable for storing codewords, which codewords define a bitsequence and length of the bitsequence. A bitmap indicates the presence of codewords in the codetable. The bitmap is addressed by one or more bits from the fixed bit length. An addresser converts one or more bits from the fixed bit length data to a codetable address, which codetable address is used to index the codetable.

10 Claims, 4 Drawing Sheets

VARIABLE LENGTH CODER

BACKGROUND OF THE INVENTION

1. Field of the Invention

The invention relates to a variable length coder (also known as "Huffman coder", or "entropy" for use in digital audio/video coders and the like.

2. Related Art of the Invention

In many digital video coders a lossy coding algorithm based on the discrete cosine transform (DCT) precedes a lossless encoder based on variable length coding (VLC).

The transform coefficients are run-levelled and entropy coded, in which the most common run-level combinations are given the shortest codes and the less common combinations longer codes. A run-level represents a group of 1 or more transform coefficients as a number of 0 coefficients (run) followed by a single coefficient value (level). One example of run-level combination to codes is disclosed in Tables 1 to 4. For example, H.261 (see "Recommendation H.261—Video Codec for Audio-visual Services at p×64 kbits/s" by International Telegraph and Telephone Consultative Committee, Study Group XV, CCITT Subgroup XV Document, Report R 37, August 1990) and MPEG-1 (see "CD 11172—Coding of Moving Pictures and Associated Audio for Digital Storage Media at up to about 1.5 Mbps" by international Organization for Standardization, ISO MPEG Document, ISO-IEC/JTC1/SC2/WG8, 1992) describe audio/video codecs which require variable length coders. Emerging standard HDTV codecs will also require variable length coders.

The implementation of a variable length coder has typically been accomplished by the use of a look-up table (LUT) to translate the fixed length data to variable length data. The LUT is usually implemented using memory (for example RAM or PROM), or logic (for example PLA). Lei and Sun (see "An Entropy Coding System for Digital HDTV Applications", Shaw-Min Lei & Ming-Ting Sun, IEEE Transactions on Circuits and Systems for Video Technology, Vol. 1, March 1991) implemented a LUT using a PLA. The PLA contains the codeword bitsequence and the length of the bitsequence. The input to the PLA is the fixed length data from a run-leveller, and the output is the codeword bitsequence and the length of the bitsequence. Vogel (see "Method and Apparatus for Bit Rate Reduction", Peter Vogel, U.S. Pat. No. 4,901,075, Feb. 13, 1990) described an implementation which used a PROM to implement a LUT. The run-level fixed length data was applied directly to the address bus of the PROM, and the representation of the variable length bitsequence is output on the data bus. However, there are several problems which this invention solves. Due to the rapidly changing digital A/V coding technology, and also due to the wide range of applications, the contents of the huffman tables used for variable length coding may change. This results in a need for programmable variable length codetables. Contrary to programmability is the need for small implementation size so that inexpensive VLSI codecs can be made. An object of this invention is to implement a small, programmable architecture for variable length coding.

In MPEG-1 and H.261, the huffman tables are not continuous. Not every run-level combination exists, and of the combinations which do exist, they are not necessarily contiguous. For example, a codeword for run=6, level=0, 1, 2, & 3 exists, but not for run=6, level=4, nor for run=7, level=3. This means that an implementation using conventional memory will have "holes" of unused memory, portions of memory which contain no useful information because the run-level combination has no codeword. This is a waste of VLSI chip space. Alternatively, a PLA can be used but PLAs have more limited versatility than RAM. An object of this invention is to eliminate the wastage of codetable space by the occurrence of holes in the huffman tables. Quite often the huffman tables contain patterns in the variable length bit sequences which can be identified and used to shrink the codetable.

For example, in MPEG-1 the longest bitsequence in the DCT coefficients huffman table is 16 bits (disregarding the sign of the level). However, all of the longer bitsequence consist of a string of 0s, followed by several 1s. This pattern can be recognized and used to reduce the codetable size. An object of this invention is to eliminate the wastage of codetable space caused by storing redundant information in the codetable.

SUMMARY OF THE INVENTION

For the purpose of solving the above described problems, the present variable length coder was invented. In the present invention, a codetable is used for storing codewords each of which define a codeword bitsequence and length of said bitsequence. A bitmap is used to indicate the presence of a codeword in the codetable for a particular fixed length code input. An addresser is used to convert the fixed length code input to an address which is then used to index the codetable. The bitmap and addresser are used as means to eliminate the holes in the huffman table which occur as the result of non-contiguous codewords. A codeword translator can be used to eliminate some of the redundant information in the storage of the bitsequence codewords in the codetable.

When the fixed length input data or a subset thereof is applied to the inputs of the bitmap, the resulting output from the bitmap is an indication of whether or not the codetable contains a huffman codeword for that fixed length input data. If the bitmap indicates the codeword is missing, the bitsequence output from this variable length coder is invalid. In this case an alternate method is needed to code the fixed length data, such as coding the data as a fixed length bitsequence. When the fixed length input data or a subset thereof is applied to the inputs of the addresser, the resulting output from the addresser is an address which is used to index the codetable for that fixed length input data. The addresser allows the codewords to be stored in the codetable contiguously, so that there is no wasted space in the codetable due to invalid data. If the fixed length input data was used directly to index the codetable, many of the fixed length input data words may result in invalid bitsequence outputs from this variable length coder because there is no variable length codeword for that fixed length input data. In this case there may be contiguous groups of valid codewords separated by groups of invalid codewords. Thus, the addresser removes these holes in the huffman table. If the codetable contains the variable length codeword information as encoded data, the codeword translator is used to convert the output from the codetable into a bitsequence and length of bitsequence variable length codeword. By storing encoded data instead of lengths and bitsequence, the word width of the codetable, and therefore the overall size of the codetable is reduced.

Tables 1–4 represent run-level combination and corresponding codes.

PREFERRED EMBODIMENTS

Figure 1:
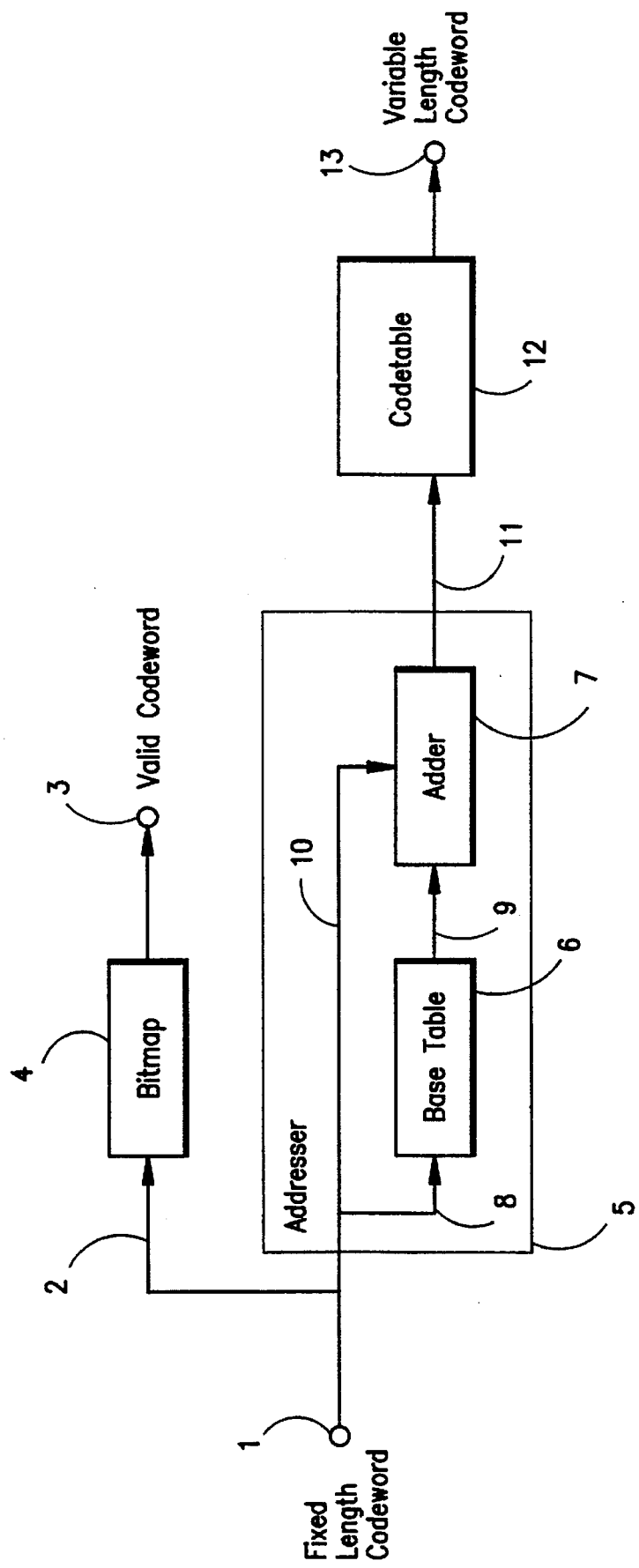
FIG. 1 is an example embodiment of the invented variable length coder.

An example embodiment of this invention is shown in FIG. 1. The input 1 of this example embodiment is fixed length data comprising a 6 bit run and an 8 bit absolute value level. An example of such data are the run-level combinations which result in a digital video encoder after the run-level coding of DCT coefficients. In this case, the run represents the number of 0 coefficients and the level represents the absolute value of the non-zero coefficient following the 0s. The bitmap input 2 for this embodiment are the 14 input bits of run and level. The bitmap output 3 is a single bit which is 1 if the codeword data is present in the codetable, and 0 otherwise. The bitmap 4 of this embodiment can be implemented using a $2^{14} \times 1$ bit memory.

The addresser 5 for the embodiment of FIG. 1 comprises a base table 6 and an adder 7. The base table 6 can be implemented using a $2^6 \times 5$ RAM whose input address lines 8 are the 6 bits of the run. The contents of the base table 6 indicate the base address 9 of a contiguous group of codeword data with the specified run in the codetable. The offset 10 from this starting address are the 8 bits of the level. The base address 9 and offset 10 are added by the adder 7 to determine the codetable address 11 where the codeword data is located. For example, for a run=4, level=2 combination the base table 6 is indexed using the run value, 4. The result is a base address 9 which indexes the codetable at the starting location of the group of all codewords which represent inputs with run=4. The offset 10 from this base is the level value, 2. In other words, the index used to find the codeword corresponding to run=4, level=2 is calculated as the contents of base table[4]+2. For this example embodiment the codetable 12 contains words comprising a "bitsequence" stored as 23 bits and "length of bitsequence" stored as 5 bits, for a total of 28 bits for each codetable entry. For example, to store the bitsequence "001101", the "length of bitsequence" is 6 and the "bitsequence" is "001101". For this embodiment, unused bits of the bitsequence are set to 0. This represents the variable length codeword 13 corresponding to the run and level fixed length input data. The maximum codelength for this embodiment is 23 bits. A codetable with up to 128 codewords can be implemented using a 128×28 bit memory. The benefit of this embodiment for this invention can be seen by comparing the size of memory and logic required for this embodiment with the size of memory required by a variable length coder implemented by a simple LUT. The embodiment of FIG. 1 requires a total of $2^{14} \times 1 + 2^6 \times 6 + 128 \times 28 = 20352$ bits of storage plus a small amount of logic.

If the variable length coder of this embodiment is implemented using a simple table, the size of the table would be $2^{14} \times 29 = 458752$ bits. The input is 14 bits for run and level so there are $2^{14}$ different input combinations. Each entry in the table would contain a bitsequence of 23 bits, a length of 5 bits and a single bit to indicate if the codeword is valid or not. Thus, each entry in the simple table would be 29 bits which include both the variable length code and the valid indicator stored in the bitmap 4 of this embodiment. The reason that the simple table is so much larger is because the simple table reserves space for codewords for all the run-level combinations, whereas the variable length coder of this embodiment removes the space in the memory where these codewords do not exist. The effect of this invention is the huge reduction in memory storage requirements for variable length coding.

Figure 2:
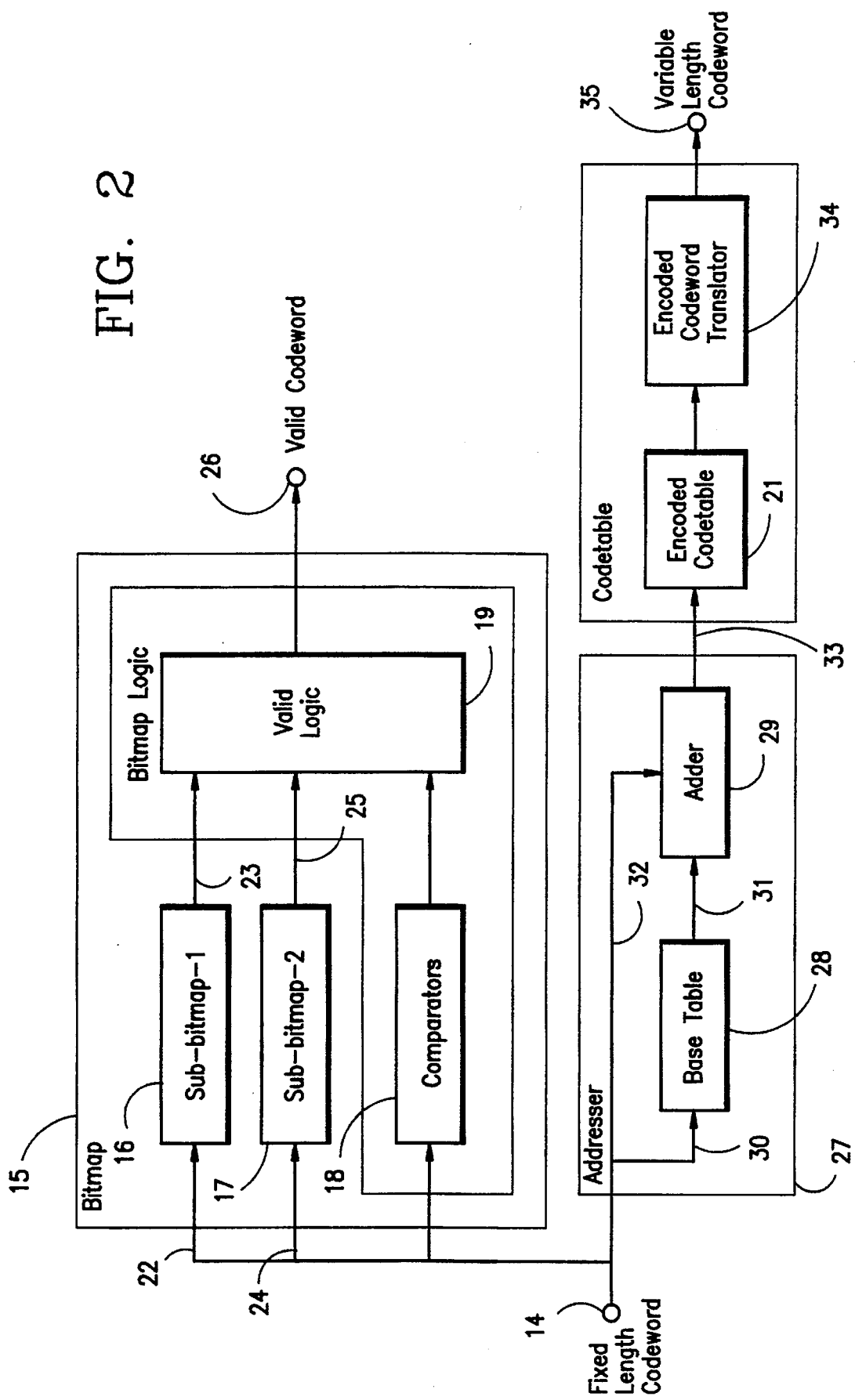
FIG. 2 is an example embodiment of the invented variable length coder.

Another example embodiment is shown in FIG. 2. The input to this example embodiment is fixed length data 14 comprising a 6 bit run and an 8 bit absolute value level. The bitmap 15 comprises 2 sub-bitmaps 16,17, some comparators 18 and a valid logic 19.

Figure 3:
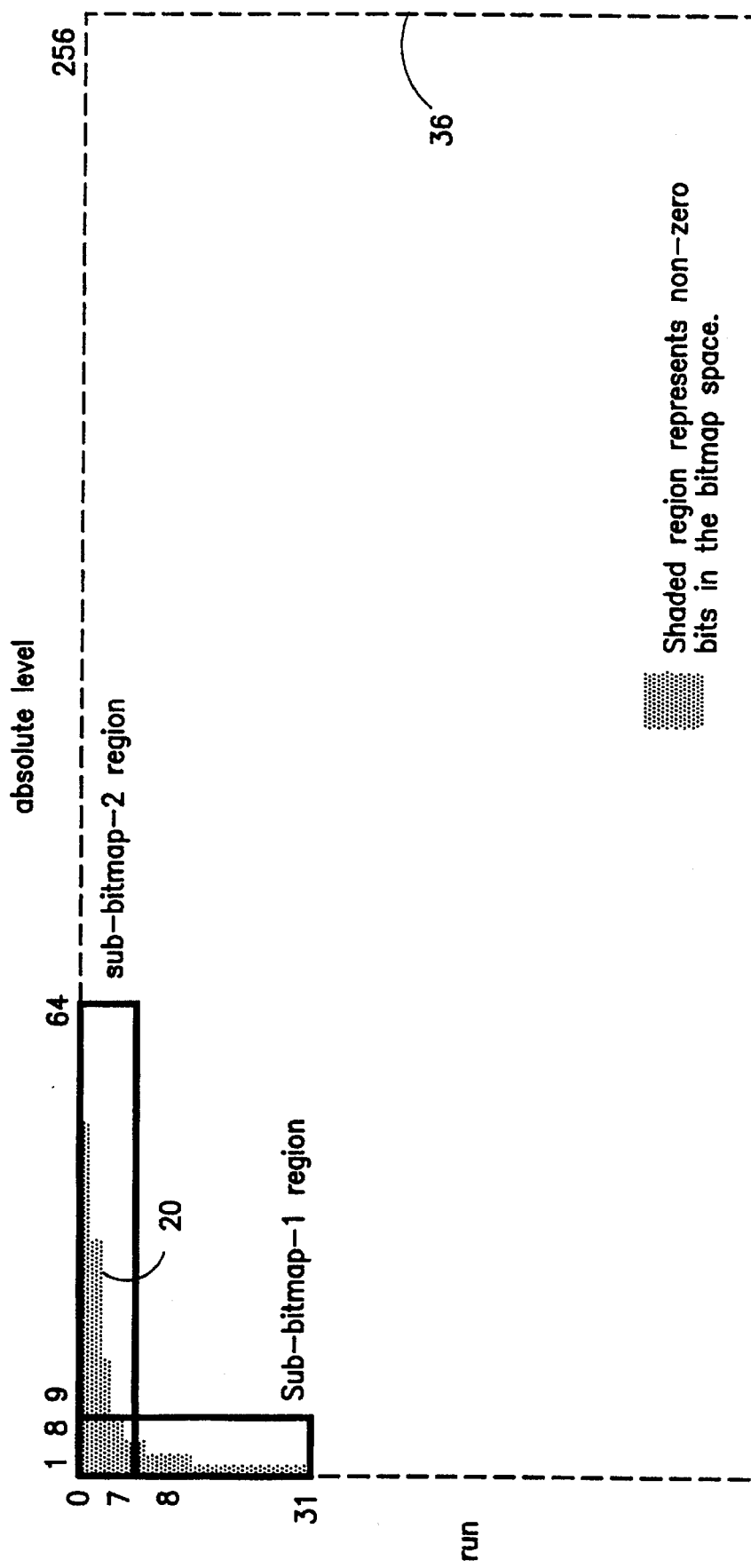
FIG. 3 describes the function of the sub-bitmaps in the embodiment of FIG. 2.

FIG. 3 represents how the 2 sub-bitmaps 16,17 are used. The dotted line 36 represents the bitmap address space in 2-dimensions. The horizontal axis is the absolute value of the level ranging from 1 to 256, represented by 8 bits because the representation is (level-1), or 0 to 255. The vertical axis is the run ranging from 0 to 63, represented by 6 bits. The shaded region 20 represents those combinations of run-levels for which the codeword is present in the encoded codetable 21. In other words, for this embodiment, it is the locations in the bitmap which contain "1". The other locations contain "0". If the bitmap inside the dotted line was implemented using a memory, it could be implemented using the same bitmap as in the first embodiment, namely a 2×1 memory. However, in this embodiment the large memory space outside of sub-bitmap-1 and sub-bitmap-2 where there are no non-zero bits is not implemented using memory. Instead, only the sub-bitmap-1 region and sub-bitmap-2 region are implemented using memories.

The input to sub-bitmap-1 22 for this embodiment are the 5 LSbits (Least Significant Bits) of run for an input range of 0 to 31, and the 3 LSbits of (level-1) for an effective input range of level of 1 to 8. The output 23 is a single bit hereafter called valid-map-1. Sub-bitmap-1 16 can be implemented using a $2^8 \times 1$ RAM. The input to sub-bitmap-2 24 for this embodiment are the 3 LSbits of run for an input range of 0 to 7, and the 6 LSbits of (level-1) for an effective input range of level of 1 to 64. The output 25 is a single bit hereafter called valid-map-2. Sub-bitmap-2 17 can be implemented using a $2^9 \times 1$ RAM. For this embodiment, the contents of the sub-bitmap RAMs are 1 if the run/level codeword is present in the codetable, and 0 otherwise. The selection of the bits used as inputs to the sub-bitmaps was made in order to minimize the total memory size required to cover the shaded region 20 in the bitmap address space 36.

The comparators 18 for this embodiment determine whether the input to each sub-bitmap is valid or not according to the following:

((run←31) && (level←8))→inrange-map-1

((run←7) && (level←64))→inrange-map-2 inrange-map-1 is "true" if the combination of run-level lies within sub-bitmap-1, and inrange-map-2 is "true" if the combination of run-level lies within sub-bitmap-2.

For this embodiment, the valid logic 19 determines the following:

((valid-map-1 && inrange-map-1)||(valid-map-2 && inrange-map-2))→valid-codeword

The valid-codeword output 26 is 1 if the codeword data is present in the encoded codetable 21.

The addresser 27 for the embodiment of FIG. 2 comprises a base table 28 and an adder 29. The base table can be implemented using a $2^5 \times 6$ RAM whose input address lines 30 are the 5 LSbits of the run. The contents of the base table indicate the base address 31 of a contiguous group of codeword data with the specified run in the codetable. The offset 32 from this base address are the 8 bits of the level. The base address and offset are added to determine the encoded codetable address 33 where the codeword data is located.

For this example embodiment the encoded codetable contains words comprising a 4 bit "length of 0s", 4 bit "length of code", and an 8 bit "bitsequence code". The translator 34 converts these values to a bitsequence of the specified number of 0s followed by the specified number of bits of the code. The output of the translator 35 is a bitsequence and length of bitsequence.

For example, the bitsequence "0000001101" is represented as 6 0s followed by a 4 bit code with a bitsequence "1101". "6" can be represented by the 4 bit "length of 0s", "4" can be represented by the 4 bit "length of code", and the "1101" can be represented by the 8 bits of "bitsequence code", where 4 of these bits are not used. The output from the translator for this example is the bitsequence length of 10 ("0000001101" is 10 bits long) represented by 5 bits, and the bitsequence "0000001101" represented by 23 bits, 10 of which are meaningful for this example. The maximum codelength for this embodiment is 23 bits because there can be up to 15 0s (the range of "length of 0s" is 0 to 15) followed by up to 8 (the range of "length of code" is 1 to 8) "bitsequence code" bits.

The benefit of this embodiment for this invention can be seen by comparing the size of memory and logic required for this embodiment with the size of memory required by a variable length coder implemented by a simple LUT. The embodiment of FIG. 2 requires a total of $2^8 \times 1 + 2^9 \times 1 + 2^5 \times 6 + 128 \times 16 = 3008$ bits of storage plus a small amount of logic. If the variable length coder of this embodiment is implemented using a simple table, the size of the table would be $2^{14} \times 29 = 458752$ bits, as described previously. The reason that the simple table is so much larger is because the simple table reserves space for codewords for all the run-level combinations, whereas the variable length coder of this embodiment removes the space in the memory where these codewords do not exist. Another reason is because the simple table contains a $2^{14} \times 1$ bitmap, whereas for this embodiment the bitmap is implemented with 2 small sub-bitmaps and some logic. A further reason is because the simple table uses 28 bits to represent the codewords, whereas for this embodiment the codewords are represented by 16 bits each and the translator is used to expand them. The effect of this invention is the huge reduction in memory storage requirements for variable length coding.

Figure 4:
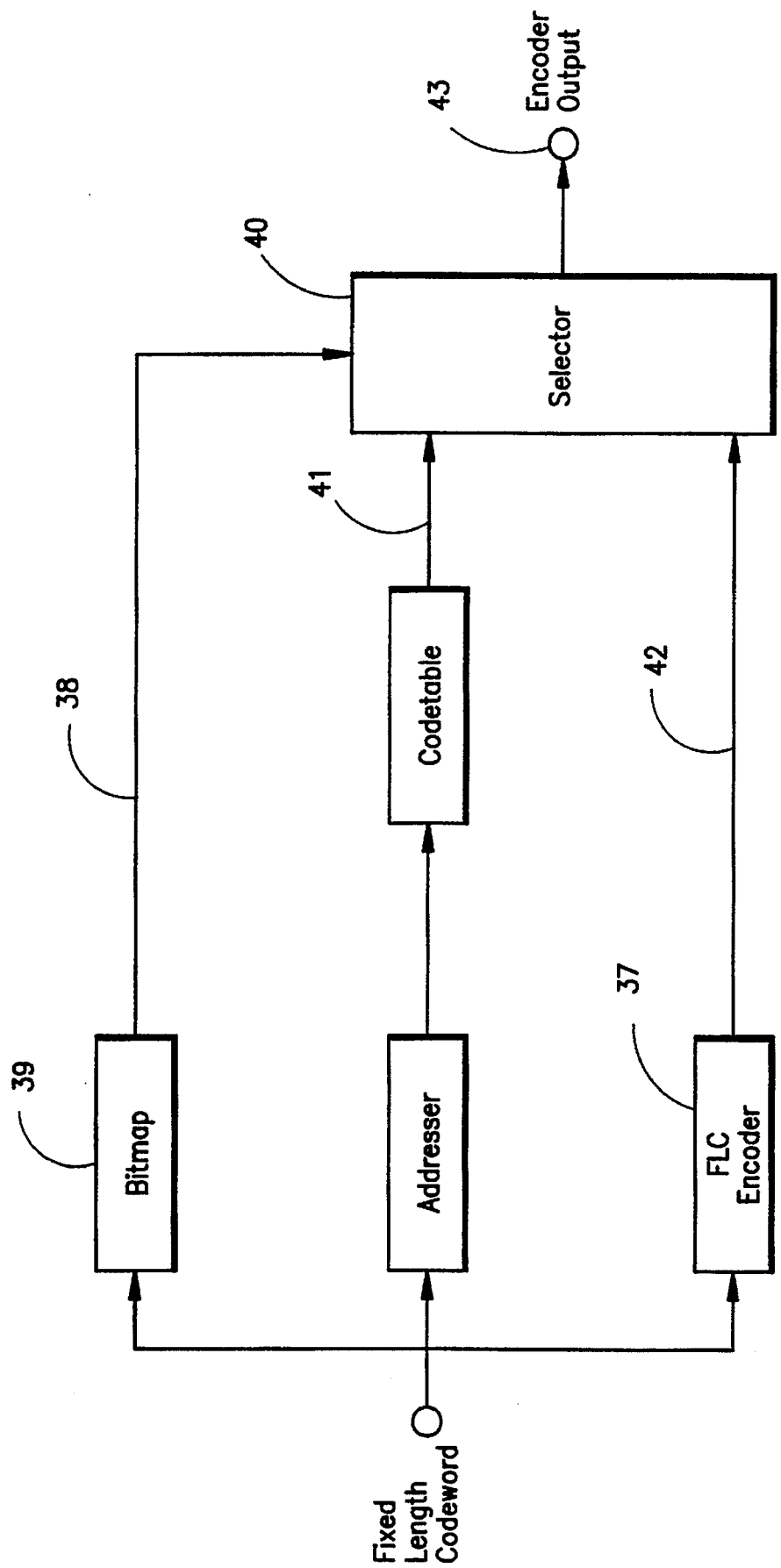
FIG. 4 describes how the invention can be combined with a fixed length data encoder.

FIG. 4 shows one way in which the previous 2 embodiments can be used in combination with a fixed length data encoder 37 to encode bitsequences of data. The valid codeword output 38 from the bitmap 39 is used by the selector 40 to select either the variable length codeword 41 or the fixed length encoded codeword 42. The output of the selector 43 is an encoded bitsequence. This arrangement can be used to encode any fixed length codeword because if a variable length code does not exist, as indicated by the valid codeword output 38, a fixed length encoded codeword will result instead.

It is possible to use a different configuration of bitmaps, both in number and size, as well as different comparators and valid logic. It is also possible to change the size of the base table and codetable, and the function of the encoded codeword translator. The choice of these items will affect the size of the coder at the expense of versatility and programmability of the coder.

The effect of this invention is the dramatic decrease in size of the variable length coder, whilst maintaining significant programmability so that support of various hufman codetables is possible with the same implementation. The effect of using an addresser and bitmap is to decrease the size of the codetable by not occupying memory space for the holes in the huffman table. The effect of using sub-bitmaps plus associated comparators and some additional logic is to decrease the size of the bitmap by determining the codes' presence in the codetable for a range of the fixed length input data. The effect of using a translator is to decrease the size of the codetable by not occupying memory with redundant information common for many or all the codewords in the codetable.

What is claimed is:

1. A variable length coder for converting fixed bit length data to variable bit length data comprising:

a codetable for storing codewords, said codewords defining a bitsequence and a length of said bitsequence;

a bitmap for indicating a presence of said codewords in said codetable, said bitmap being addressable by one or more bits from said fixed bit length data; and an addresser for converting one or more bits from said fixed bit length data to a codetable address used to index said codetable.

2. A variable length coder for converting fixed bit length data to variable bit length data according to claim 1 wherein said codetable includes an encoded codetable for storing encoded codewords, said encoded codewords representing said bitsequence and said bitsequence length; and an encoded codeword translator for translating said encoded codewords into said bitsequence and said bitsequence length.

3. A variable length coder for converting fixed bit length data to variable bit length data according claim 1 wherein said coder includes bitmap logic, and said bitmap includes a sub-bitmap, which when used in conjunction with said bitmap logic, indicates the presence of said codewords in said codetable, said sub-bitmap being addressable by one or more bits from said fixed bit length data, said bitmap logic having inputs which are one or more bits from said fixed bit length data.

4. A variable length coder for converting fixed bit length data to variable bit length data according to claim 1 wherein said coder includes bitmap logic, said codetable includes an encoded codetable for storing encoded codewords, said encoded codewords representing said bitsequence and said bitsequence length and an encoded codeword translator for translating said encoded codewords into said bitsequence and said bitsequence length, and said bitmap includes a sub-bitmap, which when used in conjunction with said bitmap logic, indicates the presence of said codewords in said codetable, said sub-bitmap being addressable by one or more bits from said fixed bit length data, said bitmap logic having inputs which are one or more bits from said fixed bit length data.

5. A variable length coder according to claim 3, wherein said bitmap logic includes a comparator for determining if a range of said fixed bit length data exceeds an input data range of said sub-bitmap; and valid logic for determining if outputs of said sub-bitmap and said comparator indicate the presence of said codewords in said codetable.

6. A variable length coder for converting fixed bit length data to variable bit length data according to claim 1 wherein said coder includes bitmap logic, said codetable includes an encoded codetable for storing encoded codewords, said encoded codewords representing said bitsequence and said bitsequence length and an encoded codeword translator for translating said encoded codewords into said bitsequence and said bitsequence length, said bitmap includes a sub-bitmap, which when used in conjunction with said bitmap logic, indicates the presence of said codewords in said codetable, said sub-bitmap being addressable by one or more bits from said fixed bit length data, said bitmap logic having inputs which are one or more bits from said fixed bit length data, and said bitmap logic includes a comparator for determining if a range of said fixed bit length data exceeds an input data range of said sub-bitmap, and valid logic for determining if outputs of said sub-bitmap and said comparator indicate the presence of said codewords in said codetable.

7. A variable length coder for converting fixed bit length data to variable bit length data according to claim 1, 2, 3 or 4 wherein said addresser comprises:

a base table for storing bases, said bases addressing a location of a group of one or more contiguous codewords in said codetable; and an adder for adding an offset to said bases and providing a result for addressing said location of a codeword in said codetable.

8. A variable length coder according to claim 7, wherein said addresser adder result is used as the input to another addresser.

9. A variable length coder for converting fixed bit length data to variable bit length data according to claim 1, 3 or 4, wherein said bitmap has two-dimensional address space.

10. A variable length coder for converting fixed bit length data to variable bit length data according to claim 9, wherein, in said two-dimensional address space, a horizontal axis corresponds to a level absolute value, and a vertical axis corresponds to run level.

* * * * *